United States Patent [19]

Kalnitsky

[11] Patent Number: 5,410,174

[45] Date of Patent: Apr. 25, 1995

[54] CONTACT STRUCTURE FOR INTEGRATED CIRCUITS

[75] Inventor: Alexander Kalnitsky, Dallas, Tex.

[73] Assignee: SGS-Thomson Microelectronics, Inc., Carrollton, Tex.

[21] Appl. No.: 102,529

[22] Filed: Aug. 4, 1993

Related U.S. Application Data

[63] Continuation of Ser. No. 738,474, Jul. 31, 1991, abandoned.

[51] Int. Cl.$^6$ .................... H01L 23/485; H01L 29/54
[52] U.S. Cl. .................... 257/384; 257/381; 257/385; 257/756; 257/757
[58] Field of Search ............... 357/59 F, 59 G, 59 H, 357/59 I, 2, 41, 71; 257/382–385, 754–757, 751, 379–381

[56] References Cited

U.S. PATENT DOCUMENTS

| | | | |
|---|---|---|---|
| 4,033,026 | 7/1977 | Pashley | 29/571 |
| 4,187,602 | 2/1980 | McElroy | 29/571 |
| 4,413,402 | 11/1983 | Erb | 29/571 |
| 4,549,199 | 10/1985 | Yamauchi et al. | 257/754 |
| 4,657,628 | 4/1987 | Holloway et al. | 29/571 |
| 4,901,134 | 2/1990 | Misawa et al. | 257/754 |
| 4,924,295 | 5/1990 | Küecher | 257/763 |
| 5,008,210 | 4/1991 | Chiang et al. | 257/515 |

FOREIGN PATENT DOCUMENTS

| | | | |
|---|---|---|---|
| 0209794 | 1/1987 | European Pat. Off. | |
| 0207180 | 8/1988 | Japan | 257/756 |
| 0306658 | 12/1988 | Japan | 257/757 |
| 0313855 | 12/1988 | Japan | 257/384 |
| 0027729 | 1/1990 | Japan | 257/755 |

OTHER PUBLICATIONS

IBM Technical Disclosure Bulletin, vol. 25 No. 8, Jan. 1983 "Buried Contact/Depletion Device Process" R. C. Dockerty, pp. 4025–4026.
IBM Technical Disclosure Bulletin, vol. 25 No. 8, Jan. 1983 "Process To Fabricate Buries Contacts", Edenfeld, et al., pp. 4067–4068.
Hewlett-Packard Journal, vol. 33 (1982) Oct., No. 10 Amstelveen, Nederland, "HQMOS: A High-Performance NMOS Technology" Horng-Sen Fu, et al., pp. 21–27.
IBM Technical Disclosure Bulletin, vol. 24, No. 7B, Dec. 1981 "Buried Contact In IC Technology", G. J. Hu and M. Y. Tsai, pp. 3696–3697.
Philips Journal of Research 44 (1989) Jul. 28, Nos. 2/3, Eindhoven, NL; "A 1 μm CMOS Process for Logic Applications" K. Osinski, et al., pp. 257–291.

Primary Examiner—Robert P. Limanek
Assistant Examiner—Peter Toby Brown
Attorney, Agent, or Firm—Kenneth C. Hill; Lisa K. Jorgenson; Richard K. Robinson

[57] ABSTRACT

A method is provided for forming a polysilicon buried contact of an integrated circuit, and an integrated circuit formed according to the same. A field oxide region is formed over a portion of a substrate leaving an exposed active region. An oxide layer is formed over the active region. A first photoresist layer is formed and patterned over the first silicon layer. The first silicon layer is then etched to form an opening therethrough to expose a portion of the oxide layer. The oxide layer is etched through the opening to expose a portion of the substrate. a conductive etch stop layer is formed over the exposed portion of the substrate and the first photoresist layer. The first photoresist layer and the etch stop layer overlying the first photoresist layer are then removed. A second silicon layer is formed over the first silicon layer and the remaining etch stop layer. A second photoresist layer is formed and patterned over the second silicon layer. The first and second silicon layers are then etched to form a conductive structure contacting the exposed portion of the substrate through the etch stop layer.

5 Claims, 2 Drawing Sheets

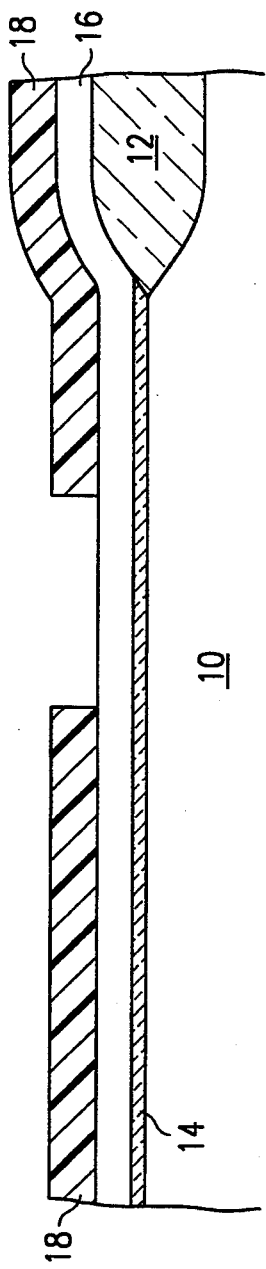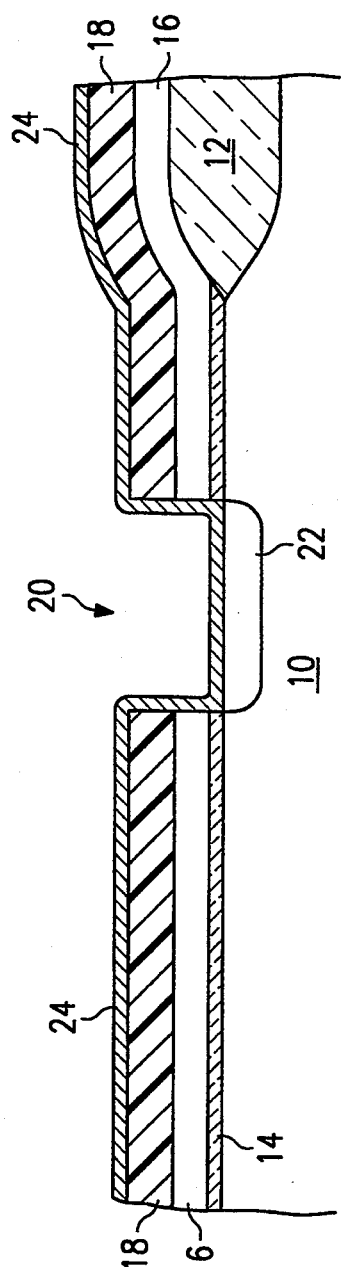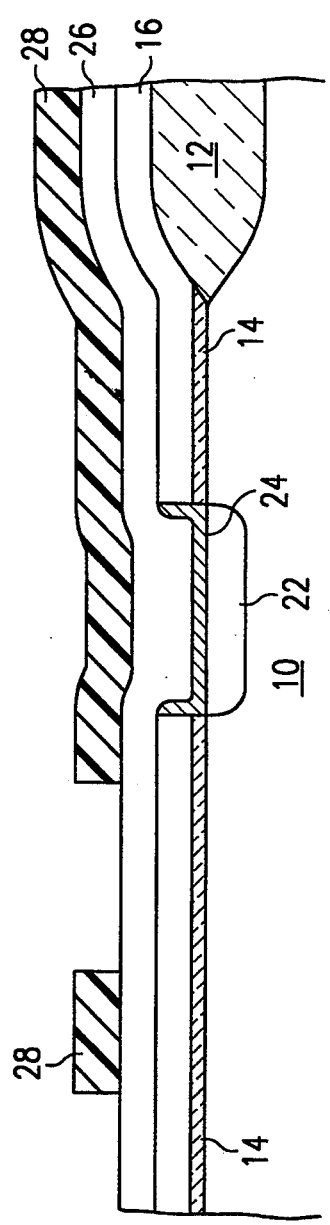

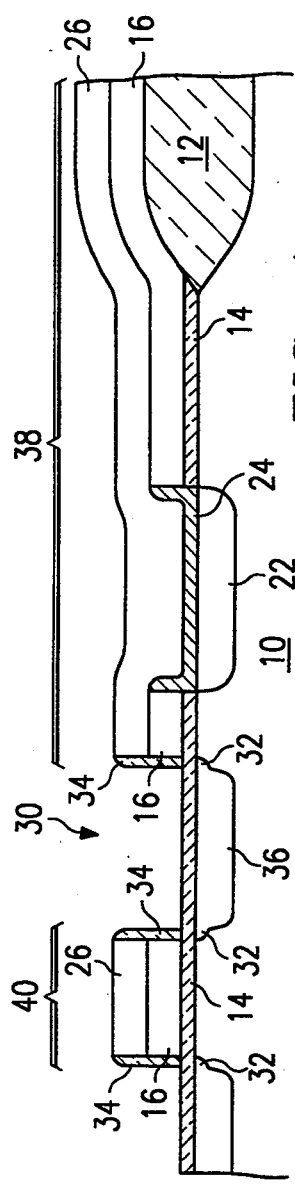
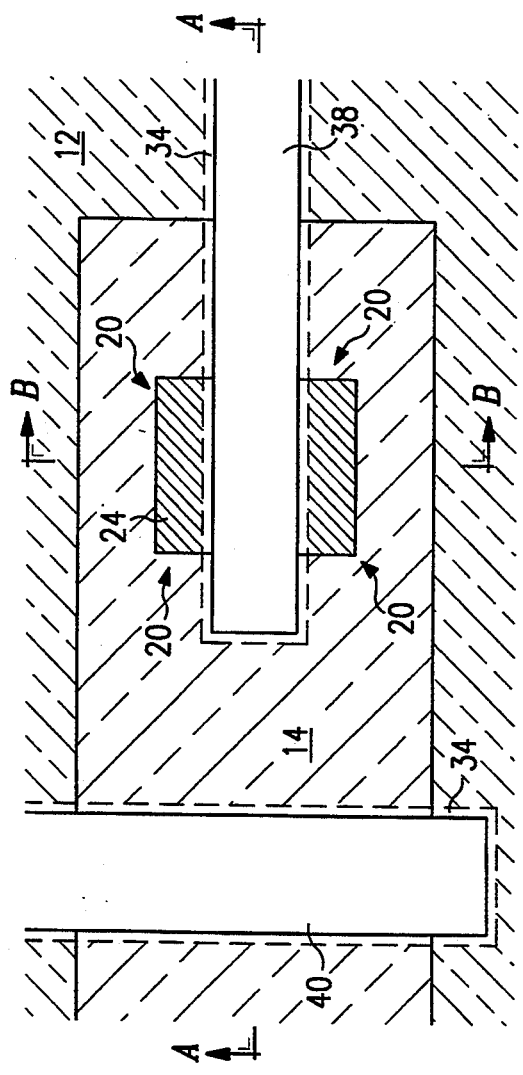
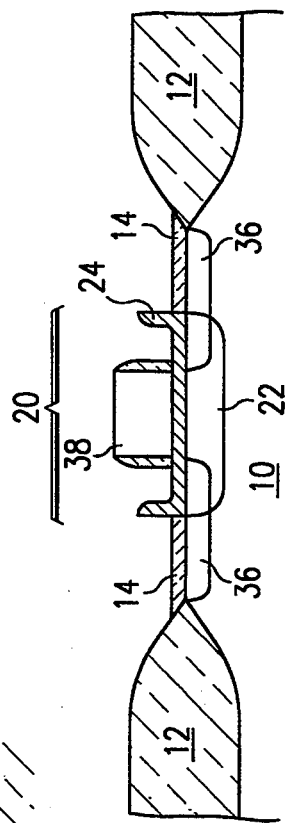
FIG. 4
FIG. 5
FIG. 6

CONTACT STRUCTURE FOR INTEGRATED CIRCUITS

This is a continuation of application Ser. No. 07/738,474, filed 31 Jul. 1991, now abandoned.

FIELD OF THE INVENTION

The present invention relates generally to semiconductor integrated circuit processing, and more specifically to forming a polysilicon buried contact.

BACKGROUND OF THE INVENTION

To create a transistor, a polysilicon layer is deposited on top of a thin oxide layer. To form a resistor, a polysilicon layer is deposited on a field oxide layer. Both of these semiconductor devices may be made from the same polysilicon layer during the same process steps. The polysilicon layer, however, must be electrically isolated from the silicon substrate in order for these devices to operate. A buried contact may also be made from the same polysilicon layer as the gate electrode of a transistor and a resistor. The buried contact, however, requires an electrical connection between the polysilicon layer and the silicon substrate, generally where polysilicon and diffusion wires interconnect.

In the case of the buried contact, an opening is made in the oxide layer overlying the silicon substrate to expose a portion of the silicon. If a split polysilicon layer, or two polysilicon layers, are used to form the gate electrodes and resistors, the second polysilicon layer may be used to form the buried contacts.

The split polysilicon process is generally used in SRAM applications. After the formation of a field oxide layer in the case of a resistor or diode, and a gate oxide layer in the case of a gate electrode, the first amorphous or polysilicon layer is deposited. The buried contact openings to the silicon substrate are patterned, etched and doped, if necessary. The second amorphous or polysilicon layer is then deposited, patterned and etched to form the upper portion of the split polysilicon of the gate electrodes and resistors as well as the buried contact in the contact opening which connects directly to the silicon substrate.

During the gate electrode and resistor split polysilicon etch, both amorphous silicon or polysilicon layers are etched over the gate oxide and field oxide regions. With the buried contact, however, since the second amorphous or polysilicon layer forms the contact, only the second layer is etched during the etch step since the first layer has been removed previously. The thickness of the second polysilicon layer is obviously less than the thickness of the total split polysilicon stack forming the gate electrodes or resistors from the first and second polysilicon layers. In other words, the distance to etch the second polysilicon layer from the top of the resistors to the substrate is substantially less than the distance to etch the layer from the top of the gate electrode or resistor to the gate oxide or the field oxide.

At the location of the buried contact, there is no natural etch stop at the surface of the substrate such as oxide. In order to completely dry etch the gate electrodes and resistors, an overetching situation occurs while etching the buried contact due to the lesser height of polysilicon over the buried contact in relation to the height of the gates and resistors. This overetching condition results in an undesirable trenching of the silicon substrate. The depth of the trench is a function of the relative thicknesses of the first and second split polysilicon layers, as well as the surface topography. These factors dictate the amount of overetch required to clear the polysilicon away from the edge of the active areas around the gate and resistor devices.

In order to prevent the trenches from forming in the substrate during the dry etch process of the second split polysilicon layer, the present invention uses an etch stop layer disposed over the silicon substrate. This additional layer will act as an etch stop in any subsequent polysilicon etch to prevent trenching the silicon substrate around the buried contact area. This layer will also improve the contact resistance between the buried contact and the substrate.

SUMMARY OF THE INVENTION

The invention may be incorporated into a method for forming a semiconductor device structure, and the semiconductor device structure formed thereby, by forming a buried contact. To form the buried contact, an oxide layer is formed over a substrate. A first silicon layer may be formed over the oxide layer at this stage. An opening through the first silicon layer and the oxide layer is formed exposing a portion of the underlying substrate. A conductive etch stop layer is then formed over the exposed substrate. A second silicon layer is formed over the first silicon layer and the etch stop layer. A portion of the first and second silicon layers is then etched to form a conductive structure contacting the exposed portion of the substrate through the etch stop layer.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIGS. 1–4 and 6 are cross-sectional views of the fabrication of a semiconductor device structure according to the present invention.

FIG. 5 is a top plan view of a portion of a semiconductor device structure according to the present invention.

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The Figures representing cross-sections of portions of an integrated circuit during fabrication are not drawn to scale, but instead are drawn so as to illustrate the important features of the invention.

Referring to FIG. 1, an integrated circuit device is to be formed in a silicon substrate 10. A field oxide layer 12 is formed over a portion of the substrate 10 by methods known in the art leaving an active region exposed. An oxide layer 14 is then formed over the exposed active region which is a portion of the substrate 10 not covered by the field oxide 12. A first silicon layer 16 is deposited over the oxide layer 14 and the field oxide layer 12. The first silicon layer may be amorphous silicon or polysilicon. Photoresist layer 18 is then formed and patterned, as known in the art, over the first silicon layer 16.

Referring to FIG. 2, the first silicon layer 16 is etched to form an opening 20 to expose a portion of the oxide layer 14. The oxide layer 14 is then etched in the opening 20 to expose a portion of the substrate 10. At this stage, the substrate 10 may be doped through opening 20 to form an active layer 22 which is oppositely doped from the underlying substrate 10. Depending upon the nature of the doping material used, the dopant may also penetrate the amorphous or polysilicon layer 16 along each sidewall in opening 20. Before any subsequent deposition steps, an in-situ predeposition cleaning of any native oxide may need to be performed.

A conductive etch stop layer 24, such as a refractory metal silicide, is deposited over the first photoresist layer 18 and the exposed portion of substrate 10 in opening 20 by methods known in the art. The thickness of the etch stop layer will be typically between approximately 100 and 1000 angstroms. The etch stop layer is deposited at a temperature which is low enough so that the first photoresist layer 18 does not flow or decompose. The actual temperature for deposition of the conductive etch stop layer will depend upon the chemical structure of the photoresist.

The conductive etch stop layer 24 may also be a refractory metal, refractory metal nitride or a composite layer such as a refractory metal/refractory metal nitride, refractory metal/refractory metal silicide or refractory metal nitride/refractory metal silicide. The conductive etch stop layer will act as an etch stop for subsequent etching processes as well as to reduce contact resistance. If a refractory metal or refractory metal nitride, for example, is used, the etch stop layer is annealed after the deposition process. Annealing, by rapid thermal annealing, will form a metal silicide in the interface between the substrate 10 and the conductive etch stop layer 24. Any refractory metal or refractory metal nitride remaining after the anneal step may be removed to clean the surface of the etch stop layer.

Referring to FIG. 3, the first photoresist layer 18 is removed using a lift-off process as known in the art. During the lift-off process, the first photoresist layer 18 and the portion of the etch stop layer 24 covering the first photoresist layer 18 are removed.

A second silicon layer 26 is next deposited over the first silicon layer 16 and the remaining conductive etch stop layer 24 by methods known in the art. Layer 26 may be comprised of amorphous silicon or polysilicon. A second photoresist layer 28 is formed and patterned over the second polysilicon layer 26 as known in the art. At this stage, the second polysilicon layer 26 may be selectively doped by known methods to achieve the doping level required for the various devices to be made from this layer.

Referring to FIG. 4, the first and second silicon layers 16 and 26 are then etched to form a conductive structure which contacts the exposed portion of the substrate 10 through the conductive etch stop layer 24. Lightly doped source/drain (LDD) regions 32 are formed in substrate 10. Oxide sidewall spacers 34 are then formed on the sidewalls of the first and second silicon layers 16 and 26. A heavily doped source/drain region 36 is then formed by methods known in the art. As will be shown by the plan view in FIG. 5, the first and second silicon layers 16 and 26 form a resistor 38 and a gate 40. Active layer 22 and the doped source/drain region 36 connect outside the plan of the drawing as will be shown in FIG. 5. Section line A—A is the line along which the cross-sections of FIGS. 1-4 are taken.

Referring to FIG. 5, the oxide layer 14 covers the substrate 10 not covered by the field oxide 12 except for the portion exposed in the opening 20. In the top plan view of FIG. 5, the oxide layer 14 is a rectangle with a window inside, surrounded by the field oxide 12. The oxide layer 14 can be viewed outside the resistor 38 and the gate 40, but underlies also those portions of the resistor 38 and the gate 40 within the rectangle, but not within the opening 20. The oxide sidewall spacers 34 surround the resistor 38 and the gate 40. The conductive etch stop layer 24 is shown through the opening 20 and is continuous under resistor 38. The etch stop layer 24 overlies the doped active layer 22 (shown in FIG. 4 and in FIG. 6) which connects the doped source/drain region 36 in the portions of the opening 20 not covered by the resistor 38. Actually, the doped source/drain region 36 underlies the oxide layer 14 on opposite sides of the gate electrode 40 except for that portion lying underneath the resistor 38. The region 36 underlies also the portions of the opening 20 not covered by the resistor 38. In FIG. 4 the doped source/drain region 36 is not shown in the right hand portion of the drawing because the cross-section is through the middle of resistor 38. In fact, section line A—A is the line along which the cross sections of FIGS. 1-4 are taken.

FIG. 6 is a cross sectional view along the line B—B as shown in the plan view of FIG. 5. Opening 20 shows the etch stop layer 24 as filling the opening 20. The doped source/drain region 36 can be seen in this drawing as being in place everywhere under the oxide layer 14 except under the resistor 38 and the gate 40 (not shown in FIG. 6).

Since the doped source/drain region 36 and the active layer 22 are both formed in these regions in the opening not covered by the resistor 38, this forms a continuous conductive region in the substrate 10, allowing the resistor 38 to connect to the doped source/drain region 36 of the gate 40.

As will be understood by those skilled in the art, oxide layer 14 protects the underlying substrate 10 during the etching of the gate 40 and resistor 38. However, there is no oxide within the opening 20 to protect the underlying substrate. The etch stop layer 24 within the opening 20 protects the underlying substrate during the etch step which forms gate 40 and resistor 38. The etch stop layer prevents trenching of the substrate 10 within the opening 20 which are not covered by the resistor 38. As will be appreciated by those skilled in the art, prevention of such trenching improves the quality of the buried contact. In addition to preventing trenching, the conductive etch stop layer 24 reduces contact resistance as known in the art.

As an alternative to the above described two layer polysilicon resistor and gate, a single polysilicon layer may be used. In such a process, the first polysilicon layer 16 is omitted. All other process steps are performed as described above.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A structure consisting of a portion of an integrated circuit device, comprising:
   a substrate having an upper surface;
   a thin oxide layer overlying a portion of the substrate upper surface;
   a gate electrode overlying the thin oxide layer, the gate electrode having a first polysilicon layer in contact with the thin oxide, and a second polysilicon layer overlying the first polysilicon layer and in contact therewith throughout the entire gate electrode, wherein the gate electrode has a first thickness equal to a sum of thicknesses of the first and second polysilicon layers;
   first and second source/drain regions within the substrate on opposite sides of the gate electrode;
   an interconnect electrode extending over a portion of the first source/drain region, the interconnect electrode having a first polysilicon layer separated from the substrate upper surface by the thin oxide layer, and a second polysilicon layer overlying the first polysilicon layer and in contact therewith, wherein a significant portion of the interconnect electrode has the first thickness; and
   a window contact on a portion of the first source/drain region, the window contact being formed from a refractory metal alloy above the substrate upper surface, the window contact further being formed at least in part within an opening through the interconnect electrode first polysilicon layer, wherein the interconnect electrode has a second thickness, less than the first thickness, over the window contact, and further wherein the interconnect electrode second polysilicon layer is in contact with the interconnect electrode first polysilicon layer throughout the entire interconnect electrode, except over the window contact;
   wherein the interconnect electrode extends over only part of the window contact with the interconnect electrode second polysilicon layer within the opening through the interconnect electrode first polysilicon layer, and wherein the interconnect electrode second polysilicon layer makes electrical contact with the first source/drain region through the window contact.

2. The structure of claim 1, wherein the refractory metal alloy comprises a refractory metal silicide.

3. A contact structure to a source/drain region of a field effect transistor, comprising:
   a substrate having an upper surface;
   a contact layer containing a refractory metal alloy overlying a portion of the substrate, such layer having a vertically projecting portion around the periphery thereof; and
   a silicon interconnect electrode overlying a portion of the substrate and only a portion of the contact layer, lying directly on the contact layer and separated from the substrate by an oxide layer.

4. The structure of claim 3, wherein the refractory metal alloy comprises a refractory metal silicide.

5. The structure of claim 3, further comprising:
   a first doped region within the substrate filling a region adjacent the silicon interconnect electrode and underlying a portion of the contact layer, but not underlying the silicon interconnect electrode; and
   a second doped region underlying the contact layer, wherein the first and second doped regions overlap beneath those portions of the contact layer which are not overlaid by the silicon interconnect electrode.

* * * * *